US012761267B2

(12) United States Patent
Lou et al.

(10) Patent No.: US 12,761,267 B2
(45) Date of Patent: Oct. 13, 2026

(54) WAFER TEST CASSETTE

(71) Applicant: XINGR TECHNOLOGIES (ZHEJIANG) LIMITED, Yiwu City (CN)

(72) Inventors: Choon Leong Lou, Singapore (SG); Ho Yeh Chen, Zhubei City (TW)

(73) Assignee: XINGR TECHNOLOGIES (ZHEJIANG) LIMITED, Yiwu City (CN)

( * ) Notice: Subject to any disclaimer, the term of this patent is extended or adjusted under 35 U.S.C. 154(b) by 207 days.

(21) Appl. No.: 18/621,800

(22) Filed: Mar. 29, 2024

(65) Prior Publication Data

US 2025/0093411 A1 Mar. 20, 2025

(30) Foreign Application Priority Data

Sep. 15, 2023 (CN) ......................... 202311197186.X
Dec. 26, 2023 (CN) ......................... 202311824348.8

(51) Int. Cl.
*G01R 31/28* (2006.01)
*G01R 1/04* (2006.01)
(Continued)

(52) U.S. Cl.
CPC ....... *G01R 31/2831* (2013.01); *G01R 1/0416* (2013.01); *G01R 1/0491* (2013.01);
(Continued)

(58) Field of Classification Search
CPC .............. G01R 31/282; G01R 31/2831; G01R 31/2886; G01R 31/2891; G01R 31/2863;
(Continued)

(56) References Cited

U.S. PATENT DOCUMENTS

| | | | | |
|---|---|---|---|---|
| 6,265,888 B1 | 7/2001 | Hsu | | |
| 2009/0230981 A1* | 9/2009 | Yasumura | .......... | G01R 31/2863 324/756.03 |
| 2021/0255219 A1* | 8/2021 | Cho | .................. | G01R 1/07364 |

FOREIGN PATENT DOCUMENTS

| | | | |
|---|---|---|---|
| CN | 112782438 A | | 5/2021 |
| CN | 216132712 U | * | 3/2022 |

(Continued)

*Primary Examiner* — Douglas X Rodriguez
*Assistant Examiner* — Kendrick X Liu
(74) *Attorney, Agent, or Firm* — Li & Cai Intellectual Property (USA) Office

(57) ABSTRACT

A wafer test cassette is provided, which includes a first housing, a second housing, and a magnetic barrier assembly. The first housing includes a first magnetic member, and the second housing includes a second magnetic member arranged corresponding to the first magnetic member. The magnetic barrier assembly is configured to be connected to the first housing or the second housing for reducing or eliminating magnetic attraction generated between the first magnetic member and the second magnetic member. The magnetic barrier assembly is configured to reduce or eliminate the magnetic attraction before the first housing and the second housing are in contact with each other. When the first housing and the second housing are correspondingly in contact with each other, an effect of the magnetic barrier assembly is released, so that the first housing and the second housing are tightly coupled to each other through the magnetic attraction.

11 Claims, 13 Drawing Sheets

(51) Int. Cl.
*G01R 1/073* (2006.01)
*G01R 1/16* (2006.01)

(52) U.S. Cl.
CPC ..... *G01R 1/07307* (2013.01); *G01R 1/07342* (2013.01); *G01R 1/16* (2013.01); *G01R 31/2862* (2013.01); *G01R 31/2863* (2013.01); *G01R 31/2867* (2013.01); *G01R 31/2868* (2013.01); *G01R 31/2875* (2013.01); *G01R 31/2891* (2013.01)

(58) Field of Classification Search
CPC ............ G01R 31/2865; G01R 31/2867; G01R 1/0408; G01R 1/0416; G01R 1/0491; G01R 1/073; G01R 1/07307
See application file for complete search history.

(56) References Cited

FOREIGN PATENT DOCUMENTS

| | | | |
|---|---|---|---|
| JP | 1068758 | A | 3/1998 |
| JP | 2004198186 | A | 7/2004 |
| JP | 200693706 | A | 4/2006 |
| JP | 4162058 | B2 | 10/2008 |
| JP | 2018105725 | A | 7/2018 |
| JP | 20217149 | A | 1/2021 |
| JP | 202134399 | A | 3/2021 |
| KR | 1020120104405 | A | 9/2012 |
| KR | 1020120116454 | A | 10/2012 |
| KR | 101805446 | B1 | 12/2017 |
| KR | 1020220061545 | A | 5/2022 |

* cited by examiner

WAFER TEST CASSETTE

CROSS-REFERENCE TO RELATED PATENT APPLICATION

This application claims the benefit of priorities to China Patent Application Nos. 202311197186X, filed on Sep. 15, 2023, and 2023118243488, filed on Dec. 26, 2023, in the People's Republic of China. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a wafer test cassette, and more particularly to a wafer test cassette having a magnetic fixation structure.

BACKGROUND OF THE DISCLOSURE

When an integrated circuit is designed for a wafer, the wafer is subjected to a burn-in test and an electrical test. Conventionally, for the burn-in test and a reliability test, each wafer is tested individually using a tester and a probe card. Each wafer is placed on a carrier and electrically contacted by the probes of the probe card to perform the test. Therefore, when the amount of wafers increases, more testers and probe cards are required, causing the test process to be time-consuming and increasing equipment costs.

In the conventional technology, in order to improve the efficiency of the burn-in test, a composite test unit system has been developed to allow the burn-in test on several wafers to be simultaneously performed. Such a system includes multiple test units for the wafers to be respectively configured therein. Further, each test unit includes at least one chuck configured to fix the wafer, and wafer is connected to the tester for the burn-in test or the electrical test.

For another thing, a wafer test cassette has been developed recently, in which the probe card and the wafer are pre-positioned and configured in the wafer test cassette, and the wafer test cassette is directly and electrically connected to the tester. In addition, the wafer test cassette is disposed in the test unit for the burn-in test or the electrical test. Conventionally, the upper housing and the lower housing of the wafer test cassette are combined by means of engagement or vacuum. Adoption of the engagement means for the combination of the upper housing and the lower housing may have limited fixation effect, and may cause problems with uneven force application and defamation. The vacuum means is susceptible to vacuum failure when the wafer test cassette is subjected to external forces, and may also experience deterioration of the seal members, which reduces the vacuum effect.

Therefore, how to improve the effectiveness of the wafer test cassette through structural design improvement, to overcome the above issues has become one of the important issues to be addressed in the related field.

SUMMARY OF THE DISCLOSURE

In response to the above-referenced technical inadequacies, the present disclosure provides a wafer test cassette, which includes a first magnetic member, a second magnetic member, and a magnetic barrier assembly. The first housing includes at least one first magnetic member. The second housing includes at least one second magnetic member, and the second magnetic member is arranged corresponding to the first magnetic member. When the first housing and the second housing are correspondingly in contact with each other, an accommodating space is defined between the first housing and the second housing. The magnetic barrier assembly is configured to be connected to the first housing or the second housing for reducing or eliminating magnetic attraction generated between the first magnetic member and the second magnetic member. The magnetic barrier assembly is configured to reduce or eliminate the magnetic attraction before the first housing and the second housing are in contact with each other. When the first housing and the second housing are correspondingly in contact with each other, an effect of the magnetic barrier assembly is released, so that the first housing and the second housing are tightly coupled to each other through the magnetic attraction. The first housing and the second housing tightly coupled to each other through the magnetic attraction are configured to be separable by using the magnetic barrier assembly to reduce the magnetic attraction.

In one of the possible or preferred embodiments, the first magnetic member is a permanent magnet, and the second magnetic member is the permanent magnet or an unmagnetized magnetically permeable object. The magnetic barrier assembly is movably disposed in the first housing or the second housing and between the first magnetic member and the second magnetic member. When the magnetic barrier assembly is configured to move a position to shield the first magnetic member or the second magnetic member, the magnetic attraction generated between the first magnetic member and the second magnetic member is reduced.

In one of the possible or preferred embodiments, the first magnetic member is a non-permanent magnet (e.g., an electromagnet), the second magnetic member is a paramagnetic object, and the magnetic barrier assembly is configured to control whether or not the first magnetic member to generate a magnetic force. The magnetic barrier member is connected to the first magnetic member, and the magnetic barrier assembly is a switch or a microprocessor.

In one of the possible or preferred embodiments, the first housing has at least one first positioning structure, the second housing has at least one second positioning structure, and the first positioning structure and the second positioning structure are arranged correspondingly so as to allow the first housing and the second housing to be correspondingly in contact with each other.

In one of the possible or preferred embodiments, the wafer test cassette further includes a probe card and a wafer that are disposed in the accommodating space.

Therefore, in the wafer test cassette provided by the present disclosure, by virtue of "the wafer test cassette including the first housing and the second housing," "the first housing including the first magnetic member and the second housing including the second magnetic member," "when the first housing and the second housing are in close proximity, the magnetic attraction is generated to combine and fix the first housing and the second housing," and "the magnetic barrier assembly being configured to reduce or eliminate the magnetic attraction between the first magnetic member and the second magnetic member, so that the first housing and the second housing can be separated," a structure of the wafer test cassette can be strengthened. In addition, the combination and fixation of the first housing and the second housing can be strengthened, and alignment accuracy during the combination of the first housing and the second housing, thereby improving an effect of the wafer test cassette on fixing the wafer.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
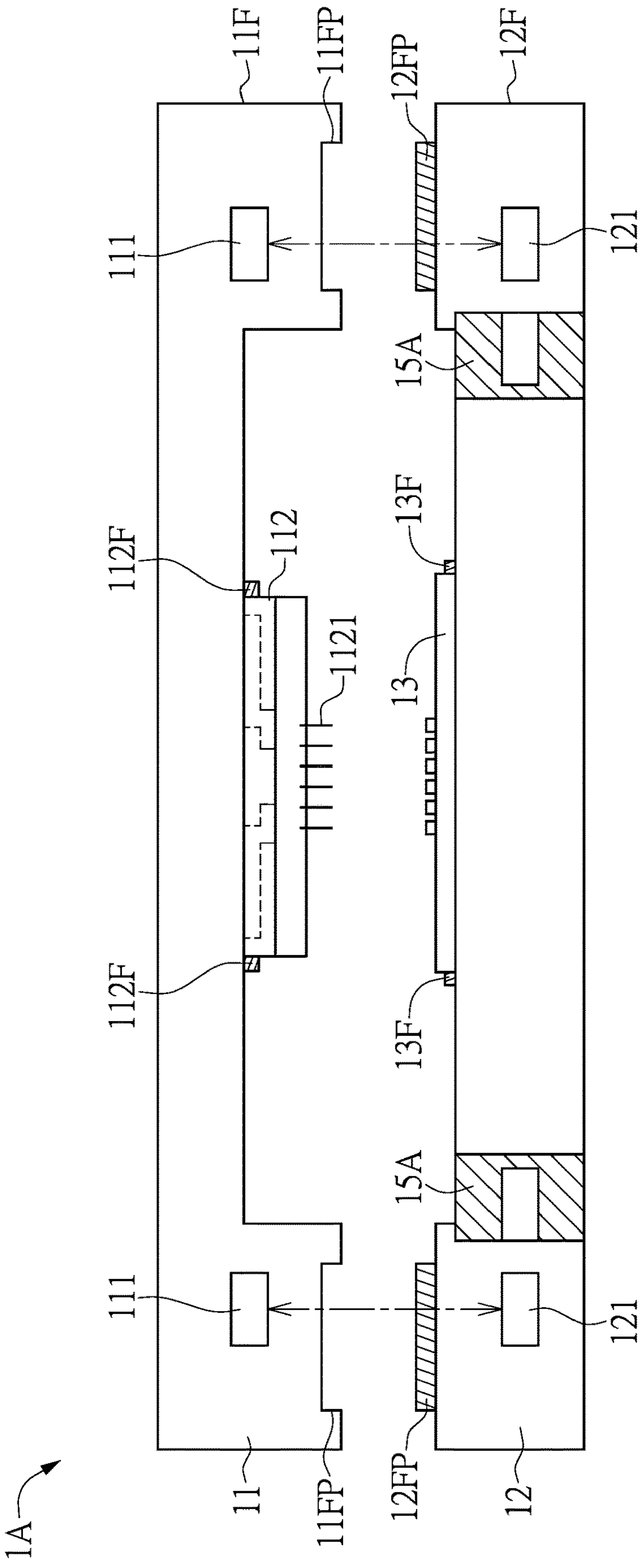
FIG. 1 is a first schematic view of a wafer test cassette according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a," "an" and "the" includes plural reference, and the meaning of "in" includes "in" and "on." Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first," "second" or "third" can be used to describe various components, signals or the like, which are for distinguishing one component/signal from another one only, and are not intended to, nor should be construed to impose any substantive limitations on the components, signals or the like.

Embodiments

Figure 2:
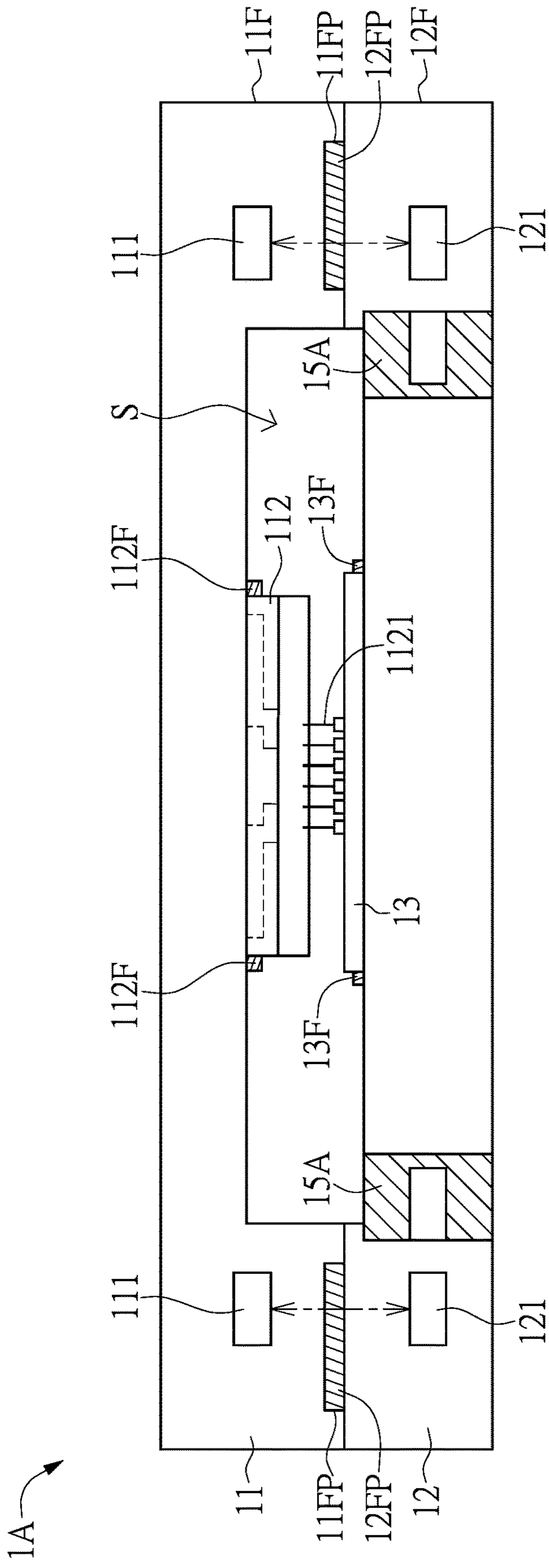
FIG. 2 is a second schematic view of the wafer test cassette according to the first embodiment of the present disclosure.
Figure 3:
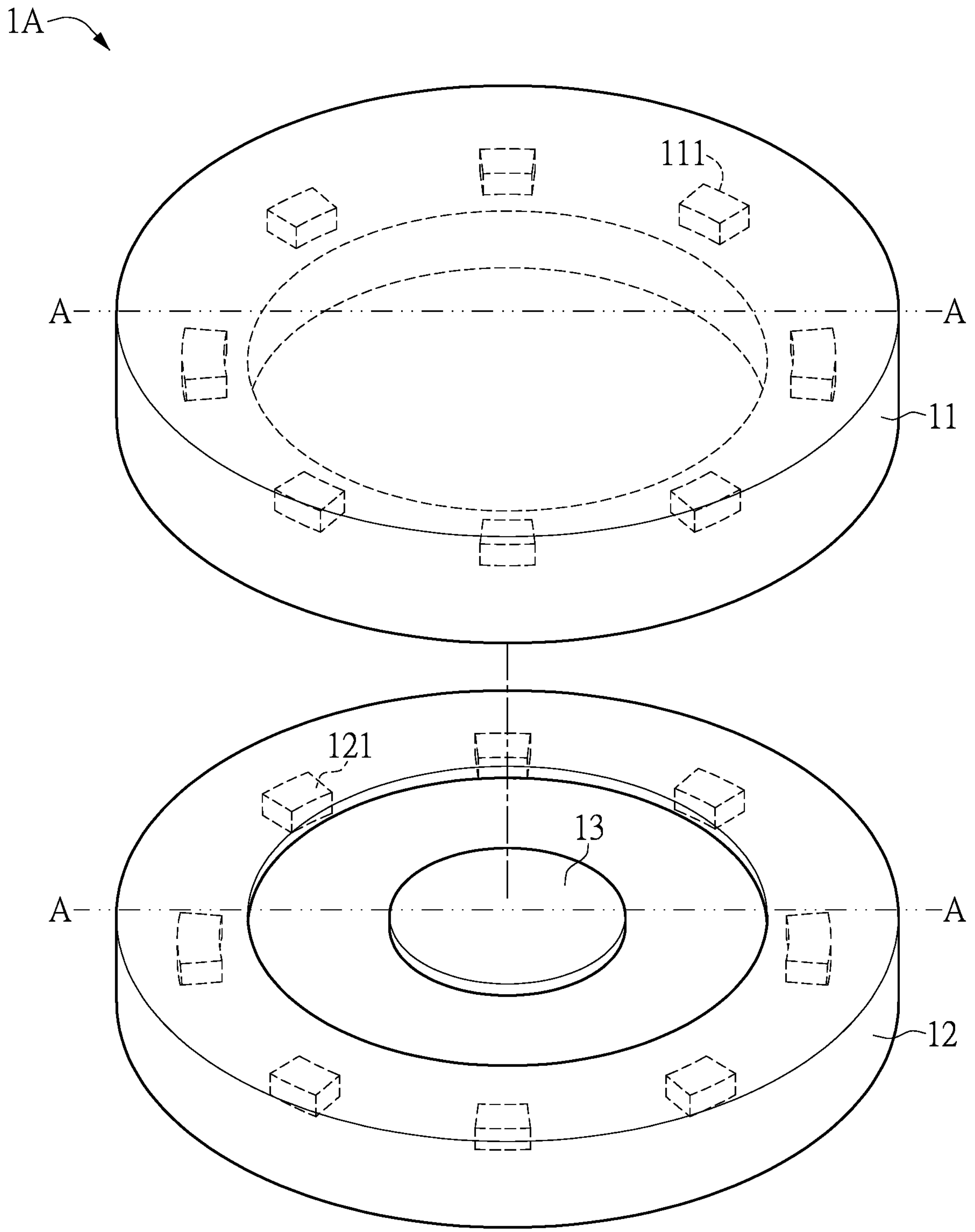
FIG. 3 is a schematic perspective view of the wafer test cassette according to the first embodiment of the present disclosure.
Figure 4:
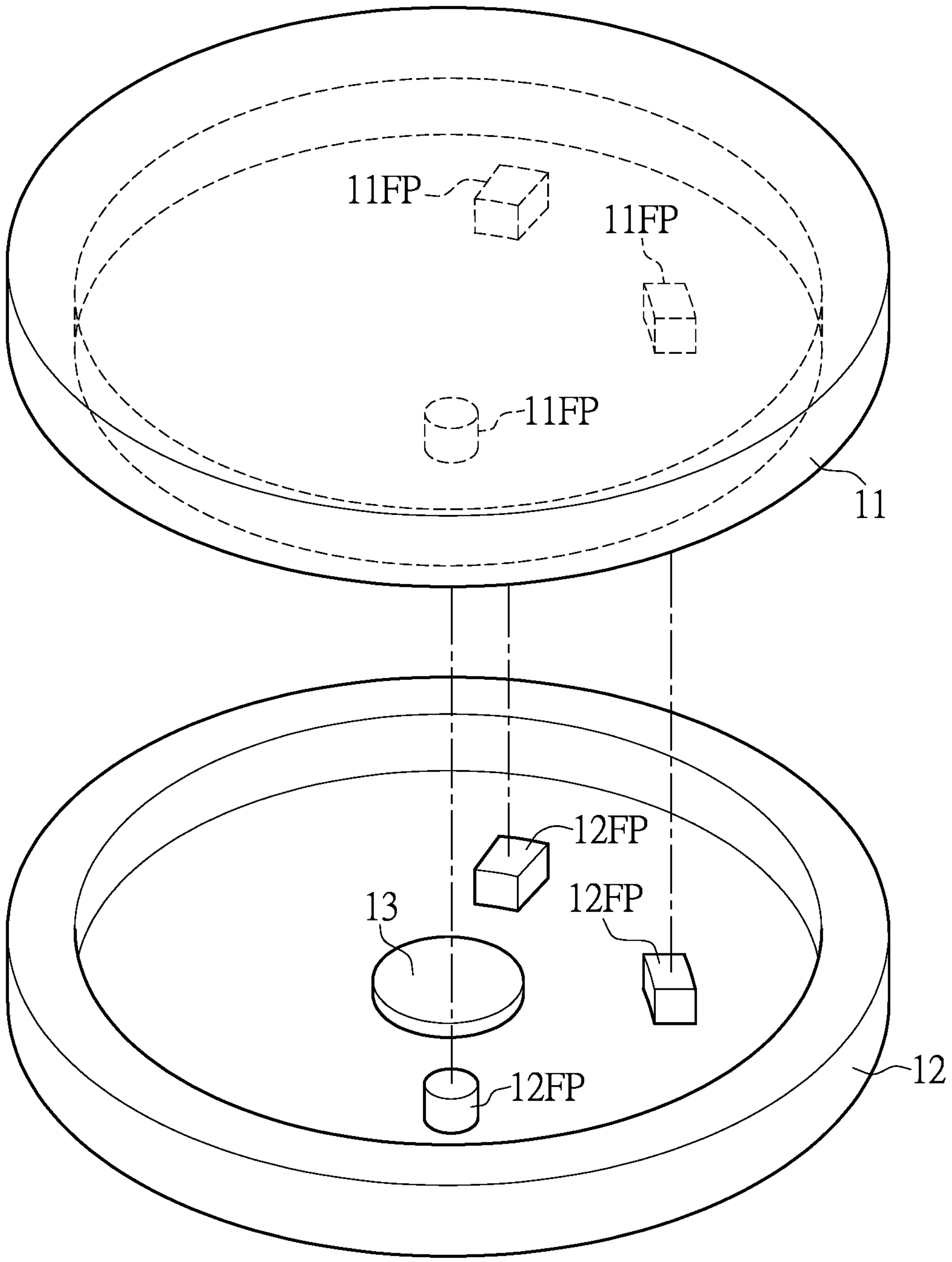
FIG. 4 is a schematic perspective view of a first housing and a second housing according to the first embodiment of the present disclosure.

Reference is made to FIG. 1 to FIG. 4, in which FIG. 1 is a first schematic view of a wafer test cassette according to a first embodiment of the present disclosure, FIG. 2 is a second schematic view of the wafer test cassette according to the first embodiment of the present disclosure, FIG. 3 is a schematic perspective view of the wafer test cassette according to the first embodiment of the present disclosure, and FIG. 4 is a schematic perspective view of a first housing and a second housing according to the first embodiment of the present disclosure.

A wafer test cassette 1A includes a first housing 11 and a second housing 12. The first housing 11 includes a first magnetic member 111, and the second housing includes a second magnetic member 121. In the present embodiment, the wafer test cassette 1A is shown from a side view in FIG. 1 and FIG. 2.

In the present embodiment, a shape of the wafer test cassette 1A can be square, circular, or other shapes, which can be adjusted according to practical requirements, but the present disclosure is not limited thereto.

As shown in FIG. 1 and FIG. 2, the wafer test cassette 1A includes at least one set of the first magnetic member 111 and the second magnetic member 121 that corresponds to each other, the first magnetic member 111 is arranged at a periphery the first housing 11, and the second magnetic member 121 is arranged at a periphery of the second housing 12. Each set of the first magnetic member 111 and the second magnetic member are arranged correspondingly. That is, a position of the first magnetic member 111 arranged in the first housing 11 corresponds to a position of the second magnetic member 12 arranged in the second housing 12.

A servo motor or a stepper motor can be used as a driving device for the first housing 11 and the second housing 12 of the wafer test cassette 1A to combine. The servo motor or the stepper motor can be used to provide a more precise driving force for a smooth coupling process between the first housing 11 and the second housing 12 when the first housing 11 and the second housing 12 are in close proximity to each other.

When the first housing 11 and the second housing 12 are provided in close proximity, magnetic attraction is generated as the first magnetic member 111 and the second magnetic member 121 attract each other. However, too strong the magnetic attraction may lead to an excess contact force between the first housing 11 and the second housing 12, causing damage to a probe or a wafer. Therefore, the wafer test cassette of the present disclosure further includes a magnetic barrier assembly configured for reducing or eliminating the magnetic attraction between the first magnetic member 111 and the second magnetic member 121. The magnetic barrier assembly is configured to be connected to the first housing 11 or the second housing 12 to or prevent the magnetic attraction between the first magnetic member 111 and the second magnetic member 121 before the first housing 11 and the second housing 12 come into contact with each other.

In the present embodiment, each of the first magnetic member 111 and the second magnetic member 121 is a paramagnetic object, such as a permanent magnet, a non-permanent magnet, and an unmagnetized magnetically permeable object.

In the case where the first magnetic member 111 and the second magnetic member 121 are both the permanent magnets, or where one of the first magnetic member 111 and the second magnetic member 121 is the permanent magnet, and another is the non-permanent magnet, an end of the first magnetic member 111 and an end of the second magnetic member 121 that face each other are configured to have different polarities, so that the magnetic attraction is enabled to be generated between the first magnetic member 111 and an end of the second magnetic member 121.

In certain embodiments, one of the first magnetic member 111 and the second magnetic member 121 is the non-permanent magnet, such as an electromagnet, and another is the paramagnetic object, such as the magnetically permeable object such as iron, cobalt, and nickel. In certain embodiments, the paramagnetic object is the permanent magnet or the electromagnet.

Referring to FIG. 1 and FIG. 2, the first magnetic member 111 and the second magnetic member are respectively disposed in the first housing 11 and the second housing 12. In certain embodiments, the first housing 11 has at least one first positing structure and the second housing 12 has at least one second positioning structure. For example, the first positioning structure can be a first protruding structure 11F extending downwardly from the periphery of the first housing 11. Similarly, the second positioning structure can be a second protruding structure 12F extending upwardly from the periphery of the second housing 12. In the present embodiment, the first magnetic member 111 is disposed in the first protruding structure 11F, and the second magnetic member 121 is disposed in the second protruding structure 12F. However, the present disclosure is not limited thereto. The first protruding structure 11F and the second protruding structure 12F are arranged correspondingly. When the first housing 11 and the second housing 12 are tightly coupled to each other through a cooperation of the first magnetic member 111 and the second magnetic member 121, the first protruding structure 11F and the second protruding structure 12F are tightly coupled to each other. In certain embodiments, a number of each of the first magnetic member 111 and the second magnetic member 121 can be one or multiple, and the first magnetic member(s) 111 and the second magnetic member(s) 121 are arranged correspondingly. In other words, the first magnetic member 111 and second magnetic member 121 can be respectively disposed at any positions of the first housing 11 and the second housing 12 that correspond to each other. In the embodiment shown in FIG. 3, multiple first magnetic members 111 and multiple second magnetic members 121 are provided. As shown in FIG. 1 and FIG. 2, the first housing 11 and the second housing 12 of the wafer test cassette 1A can be fixedly coupled to each other through the magnetic attraction generated by the first magnetic member 111 and the second magnetic member 121. In the present embodiment, the first magnetic member 111 and the second magnetic member 121 are arranged in a manner that a mutually attractive magnetic force is generated, i.e., a surface of the first magnetic member 111 and a surface of the second magnetic member 121 facing each other as described above have opposite polarities. In other words, the present disclosure does not limit that the first magnetic member 111 and the second magnetic member 121 need to face each other, and the scope of the present disclosure to protect is that as long as the first housing 11 and the second housing 12 can be fixedly coupled to each other through the magnetic attraction generated by the cooperation of the first magnetic member 111 and the second magnetic member 121. In addition, when the first housing 11 is correspondingly in contact with the second housing 12, an accommodating space S is defined between the first housing 11 and the second housing 12.

In the embodiment shown in FIG. 1 and FIG. 2, the first magnetic member 111 is arranged at the periphery of the first housing 11, and the second magnetic member 121 is arranged at the periphery of the second housing 12, i.e. two sides of the accommodating space S. However, in certain embodiments, other sets of the first magnetic member 111 and the second magnetic member 121 can also be disposed at other positions of the wafer test cassette 1A, e.g., above or below the accommodating space S. A magnitude of the magnetic attraction between the first magnetic member 111 and the second magnetic member 121, or a distribution of the first magnetic member 111 and the second magnetic member 121 can be adjusted according to user's needs, such as a sealing property between the first housing 11 and the second housing 12, but the present disclosure is not limited thereto.

In certain embodiments, the first housing 11 and the second housing can respectively have engagement structures, e.g., male/female engagement structures, so that the first housing 11 and the second housing 12 can be aligned with each other. In the embodiment shown in FIG. 1 and FIG. 2, the first protruding structure 11F of the first housing 11 has an engagement structure 11FP, and the second protruding structure 12F of the second housing 12 has a further engagement structure 12FP that corresponds to the engagement structure 11FP. The engagement structure 11FP can be or can be not arranged corresponding to the first magnetic member 111. Similarly, the further engagement structure 12FP can be or can be not arranged corresponding to the second magnetic member 121. However, the present disclosure does not limit that the engagement structures need to be arranged at the first protruding structure 11F of the first housing 11 and the second protruding structure 12F of the second housing 12. In certain embodiments, as shown in FIG. 4, the engagement structure 11FP and the further engagement structure 12FP are respectively arranged on a lower surface of the first housing 11 and an upper surface of the second housing 12. In other words, in the embodiment shown in FIG. 4, the engagement structure 11FP and the further engagement structure 12FP are corresponding arranged in the accommodating space S.

In certain embodiments, the first housing 11 and the second housing 12 respectively have the engagement structures, such as the engagement structure 11FP and the further engagement structure 12FP as described above. When the first housing 11 and the second housing 12 are aligned and positioned, the first housing 11 and the second housing 12 can be fixedly coupled to each other through the magnetic attraction between the first magnetic member 111 and the second magnetic member 121, so as to achieve an effect of interlocking the first housing 11 and the second housing 12.

As shown in FIG. 1 to FIG. 4, the magnetic barrier assembly is a magnetic shielding member 15A in an application of the permanent magnet, which is configured to move laterally to shield the second magnetic member 121, so that the magnetic attraction between the first magnetic member 111 and the second magnetic member 121 can be blocked. However, in certain embodiments, the magnetic barrier assembly can be a switch or a microprocessor in an application of the electromagnet. In certain embodiments, the magnetic barrier assembly can also be a magnetic force generating assembly, such as the electromagnet. In the embodiment shown in FIG. 1, the first housing 11 is also provided with a probe card 112, which includes one or more probes 1121. When the first housing 11 and the second housing 12 are coupled to each other, the one or more probes 1121 project toward the second housing 12. Further, in the present embodiment, the wafer test cassette 1A is also provided with a wafer 13, which is carried by the second housing 12. When the first housing 11 and the second housing 12 are coupled to each other, the one or more probes 1121 project toward the second housing 12 to be abutted against the wafer 13, so that the one or more probes 1121 are correspondingly and electrically connected to pads of the wafer 13, i.e., test contacts. In other words, the probe card 112 and the wafer 13 are both arranged in the accommodating space S. In certain embodiments, the wafer 13 is electrically connected to the second housing 12.

In the present embodiment, the first housing 11 includes certain mechanisms, such as a first fixing member 112F, to fix the one or more probes 112. The first fixing member 112F is arranged on one side of the first housing 11 that face the probe card 112 for engagedly fixing the probe card 112. In the present embodiment, the first fixing member is arranged on an outer side of the probe card 112. The first fixing member 112F can also be arranged in an engagement region between the probe card 112 and the first housing 11 so as to be tightly engaged to the probe card 112.

The second housing 12 also includes certain further mechanisms, such as a second fixing member 13F, to fix the wafer 13. In the present embodiment, the second fixing member 13F is configured for fixing an outer edge of the wafer 13. The first fixing member 112F and the second fixing member 13F of the present embodiment can be implemented by utilizing other fixing structures, but the present disclosure is not limited thereto.

That is, the probe card 112 and the wafer 13 are aligned before the first housing 11 and the second housing are coupled to each other, so that at least one of the probes 1121 of the probe card 112 can be abutted against the pad of the wafer 13 when the first housing 11 and the second housing are coupled to each other.

Figure 5:
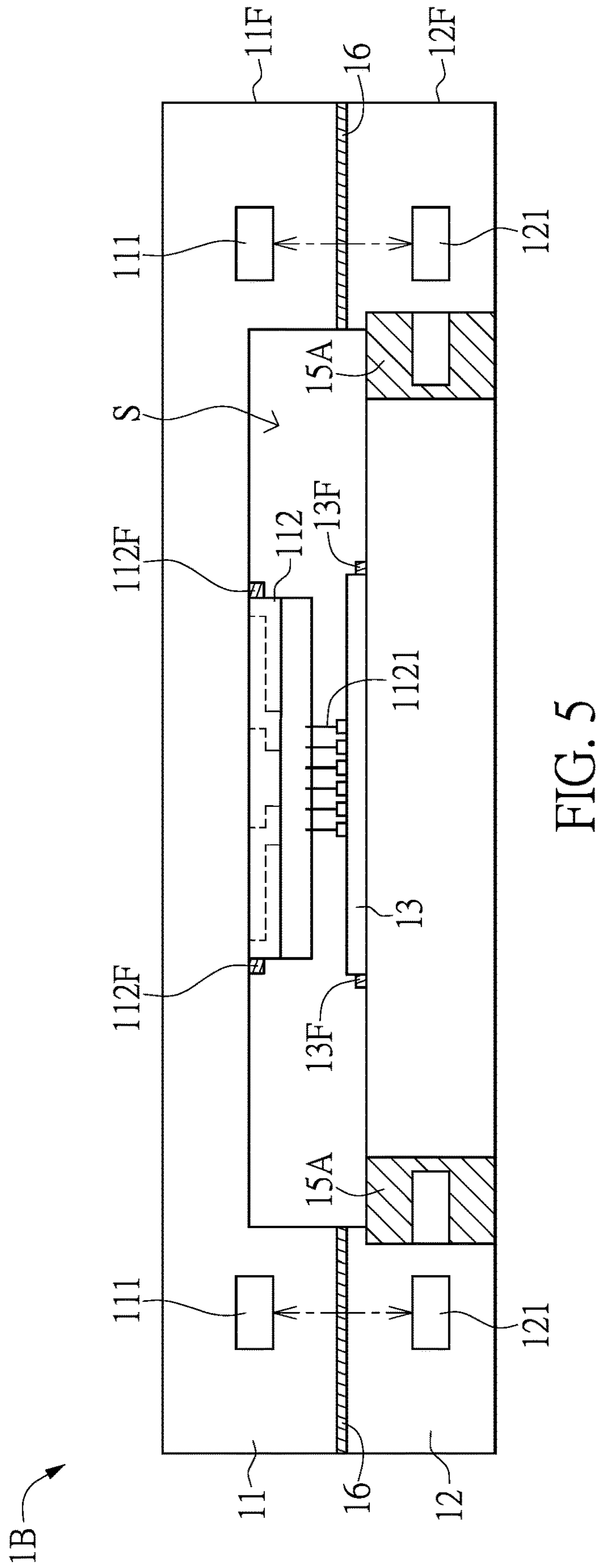
FIG. 5 is a schematic view of the wafer test cassette according to a second embodiment of the present disclosure.

Referring to FIG. 5, a wafer test cassette 1B shown in FIG. 5 includes a seal member 16 disposed between the first housing 11 and the second housing 12. In certain embodiments, the seal member 16 is an O-ring. The seal member 16 is configured for reinforcing airtightness when the first housing 11 and the second housing 12 are coupled to each other. In certain embodiments, the seal member 16 can be disposed on the first protruding structure 11F or the second protruding structure 12F, which can adjusted according to practical requirements, but the present disclosure does not limit a location of the seal member 16. In a case that the seal member 16 is disposed between the first protruding structure 11F and the second protruding structure 12F, when the first housing 11 and the second housing 12 are coupled to each other through the magnetic attraction generated between the first magnetic member 111 and the second magnetic member 121, the first housing 11 and the second housing 12 are in a tightly coupled state.

Figure 6:
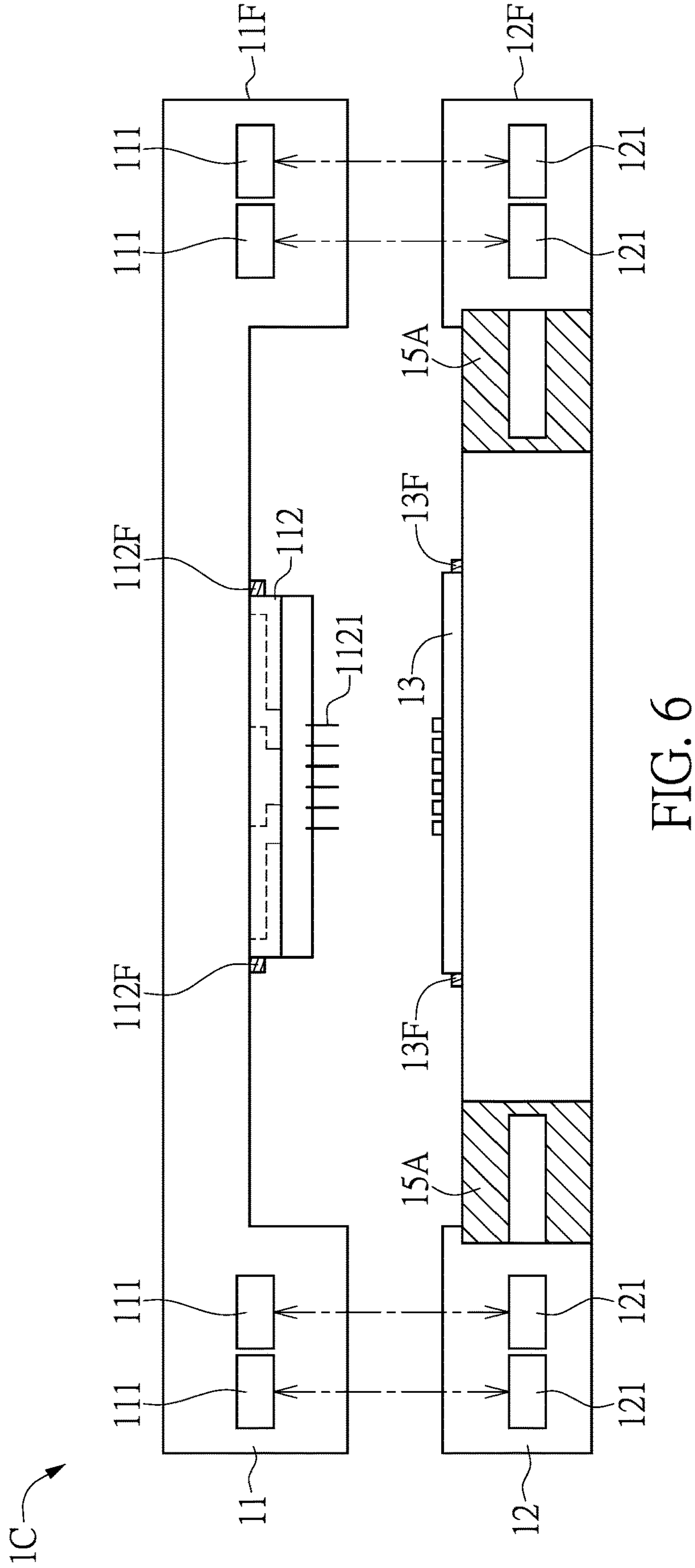
FIG. 6 is a schematic view of the wafer test cassette according to a third embodiment of the present disclosure.

Referring to FIG. 6, the second housing 12 includes two second magnetic members 121 on each of two sides, and the first housing 11 includes two first magnetic members 111 respectively on each of two sides, and the two second magnetic members 121 on each of the two sides of the second housing 12 are respectively aligned with the two first magnetic members 111 on each of the two sides of the first housing 11. Further, polarity configurations and magnitudes of the magnetic attraction between the two first magnetic members 111 on each of the two sides of the first housing 11 and the two second magnetic members 121 on each of the two sides of the second housing 12 can be different. In the present embodiment, magnetic attraction between one of the two first magnetic members 111 and one of the two second magnetic members 121 that are close to an inner edge of a wafer test cassette 1C is greater than magnetic attraction between another of the two first magnetic members 111 and another of the two second magnetic members 121 that are close to an outer edge of the wafer test cassette 1C. In addition, the first magnetic member 111 that is close to the inner edge of the wafer test cassette 1C has the N pole upward and the S pole downward, and the second magnetic member 121 corresponding to the first magnetic member 111 that is close to the inner edge of the wafer test cassette 1C has the same configuration, i.e., the N pole upward and the S pole downward. Further, the first magnetic member 111 that is close to the outer edge of the wafer test cassette 1C has the N pole downward and the S pole upward, and the second magnetic member 121 corresponding to the first magnetic member 111 that is close to the outer edge of the wafer test cassette 1C has an opposition configuration, i.e., the S pole downward and the N pole upward. In such case, in the absence of interference from the magnetic shielding member 15A, the first housing 11 and the second housing 12 are tightly coupled to each other by the magnetic attraction between the first magnetic members 111 and the second magnetic members 121 that are close to the outer edge of the wafer test cassette 1C. When the magnetic attraction between the first magnetic members 111 and the second magnetic members 121 that are close to the inner edge of the wafer test cassette 1C is shielded using the magnetic shielding member 15A, magnetic repulsion between the first magnetic members 111 and the second magnetic members 121 that are close to the outer edge of the wafer test cassette 1C is substantially equal to the magnetic attraction between the first magnetic members 111 and the second magnetic members 121 that are close to the inner edge of the wafer test cassette 1C, so that the magnetic attraction generated close to the inner edge of the wafer test cassette 1C and the magnetic repulsion generated close to the outer edge of the wafer test cassette 1C can cancel out, thereby separating the second housing 12 from the first housing 11.

Figure 7A:
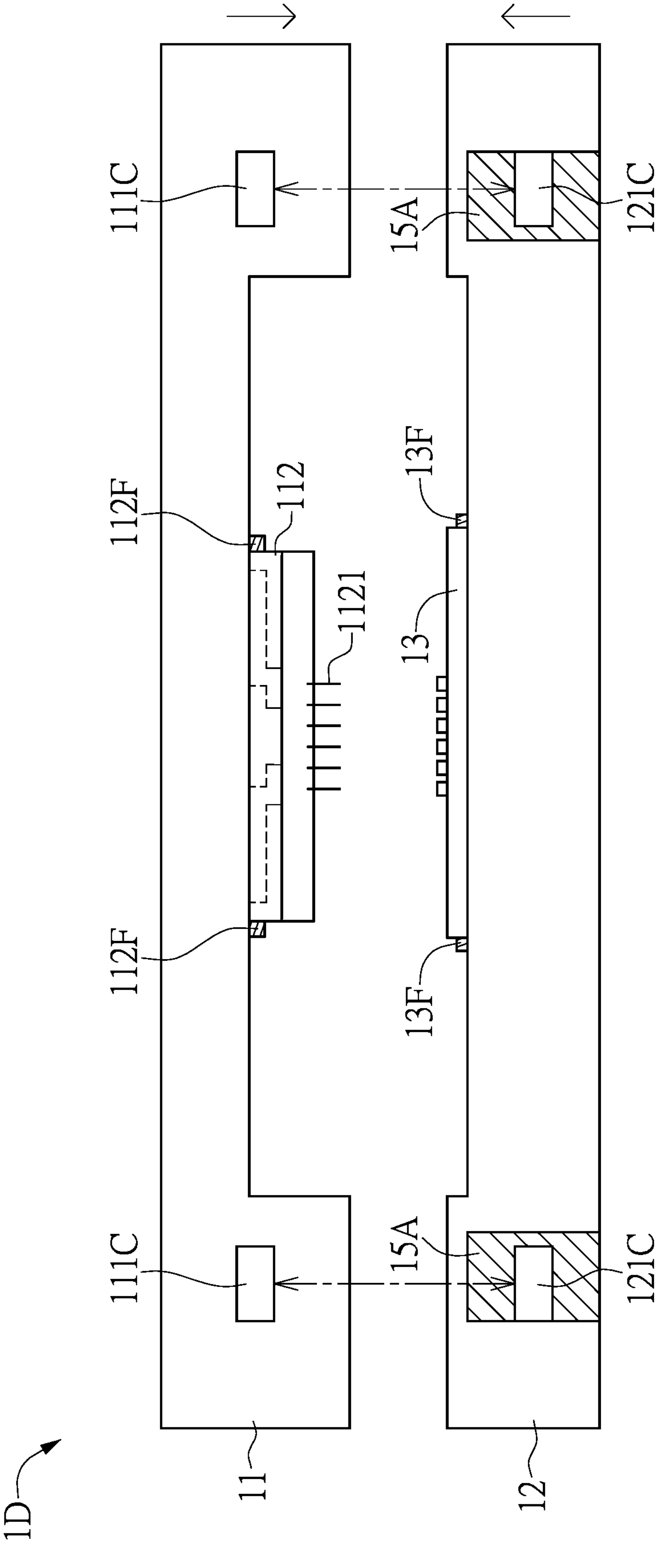
FIG. 7A is a first schematic view of the wafer test cassette according to a fourth embodiment of the present disclosure.
Figure 7B:
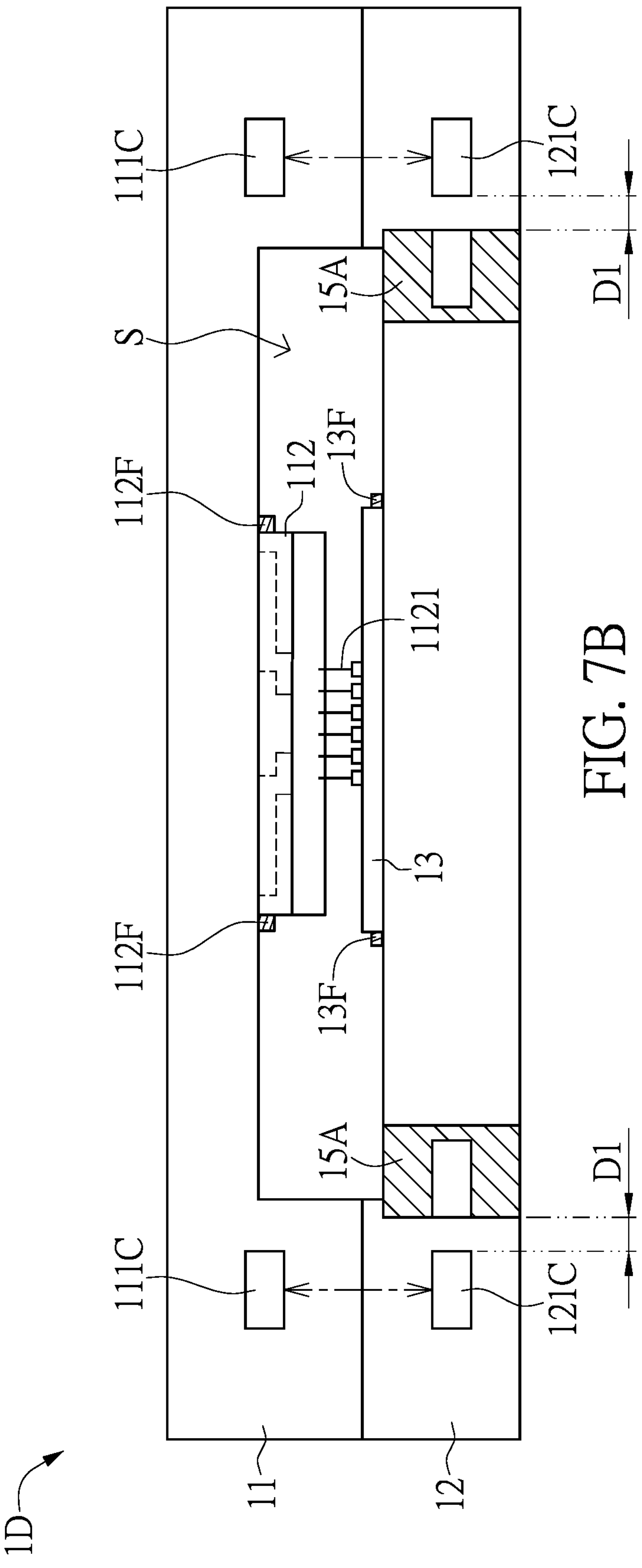
FIG. 7B is a second schematic view of the wafer test cassette according to the fourth embodiment of the present disclosure.
Figure 7C:
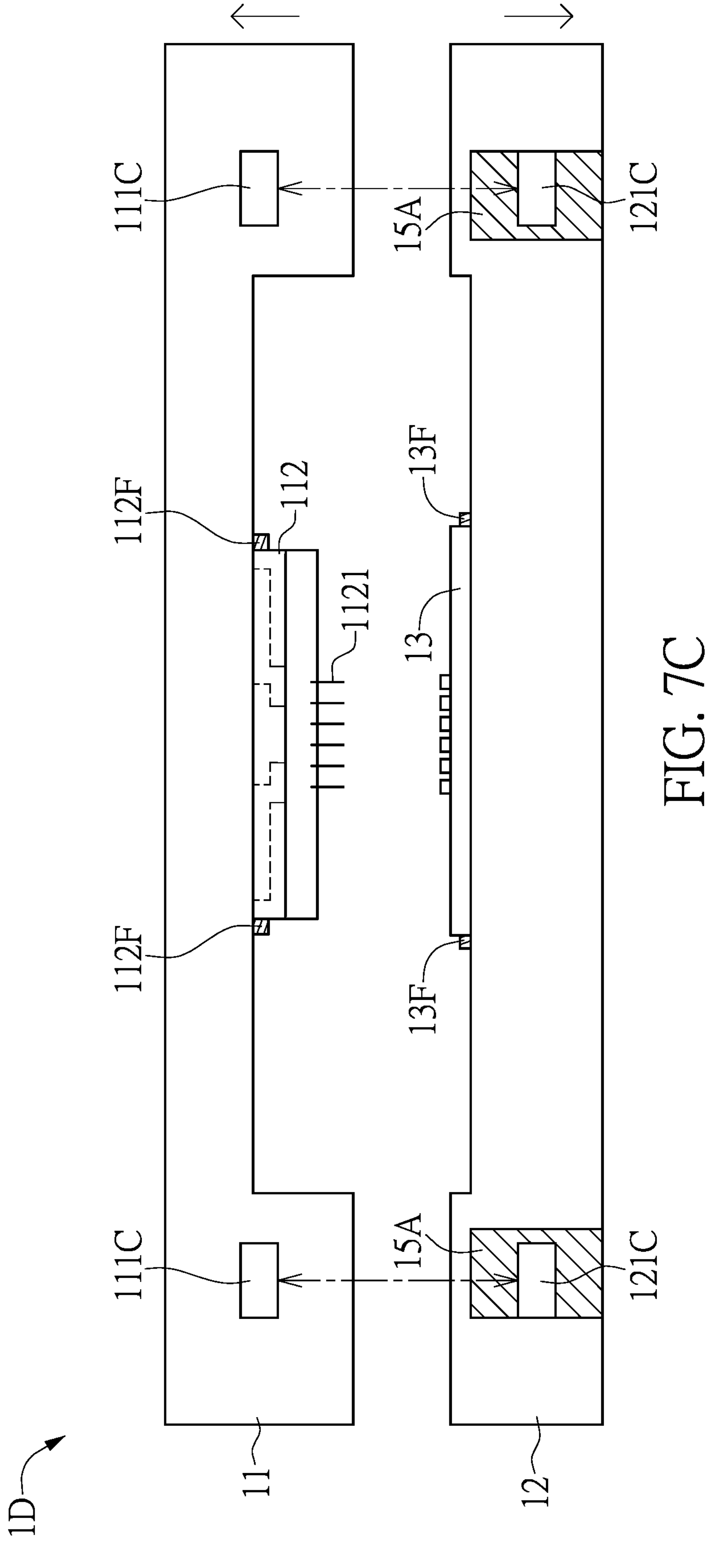
FIG. 7C is a third schematic view of the wafer test cassette according to the fourth embodiment of the present disclosure.

Reference is made to FIG. 7A to FIG. 7C, in which FIG. 7A is a first schematic view of the wafer test cassette according to a fourth embodiment of the present disclosure, FIG. 7B is a second schematic view of the wafer test cassette according to the fourth embodiment of the present disclosure, and FIG. 7C is a third schematic view of the wafer test cassette according to the fourth embodiment of the present disclosure.

In the present embodiment, a structure and a function of a wafer test cassette 1D are similar to those of the wafer test cassette 1A in the first embodiment. In the present embodiment, a first magnetic member 111C of the wafer test cassette 1D is the permanent magnet, and a second magnetic member 121C is the paramagnetic object. The paramagnetic object is, for example, the magnetically permeable object such as iron, cobalt, and nickel as described above. The paramagnetic object can also be the permanent magnet.

When the first housing 11 and the second housing 12 of the wafer test cassette 1D come into closer proximity, the first housing 11 and the second housing 12 are brought in contact with each other by respective driving devices, such as the servo motor or the stepper motor, so as to be magnetically connected.

After the wafer 13 passes a test process or a burn-in process performed through the probe card 112, the first housing 11 and the second housing 12 can be separated from each other by respective driving devices, such as the servo motor or the stepper motor, by gradually increasing power.

Further, as shown in FIG. 7A, the magnetic barrier assembly of the wafer test cassette 1D is the magnetic shielding member 15A, which can be disposed on one side of the first magnetic member 111C or one side of the second magnetic member 121C. In the present embodiment, the magnetic shielding member 15A is arranged on the one side of the second magnetic member 121C. The magnetic shielding member 15 can be moved to shield the second magnetic member 121C, so that the magnetic attraction between the first magnetic member 111C and the second magnetic member 121C can be reduced or eliminated. When the first housing 11 and the second housing 12 are in close proximity, the magnetic shielding member 15A is configured to move to shield the second magnetic member 121C, so that the first housing 11 and the second housing 12 can be brought to approach and be in contact with (or coupled to) each other in an effort saving manner, avoiding damage to the wafer 13 or the probe card 112 in the wafer test cassette 1D due to excessive magnetic attraction.

As shown in FIG. 7B, when the first housing 11 and the second housing 12 are in contact with each other, the magnetic shielding member 15A is configured to move away from the second magnetic member 121C (e.g., along a direction D1), so that the magnetic attraction generated between the first magnetic member 111C and the second magnetic member 121 enables the first housing 11 and the second housing 12 to be tightly connected each other.

As shown in FIG. 7C, after the test is completed, the magnetic shielding member 15A is configured to move to shield the second magnetic member 121C to eliminate or reduce the magnetic attraction generated between the first magnetic member 111C and the second magnetic member 121, resulting in a weak coupling between the first housing 11 and the second housing 12, so that the first housing 11 and the second housing 12 can be separated in the effort saving manner.

Figure 8A:
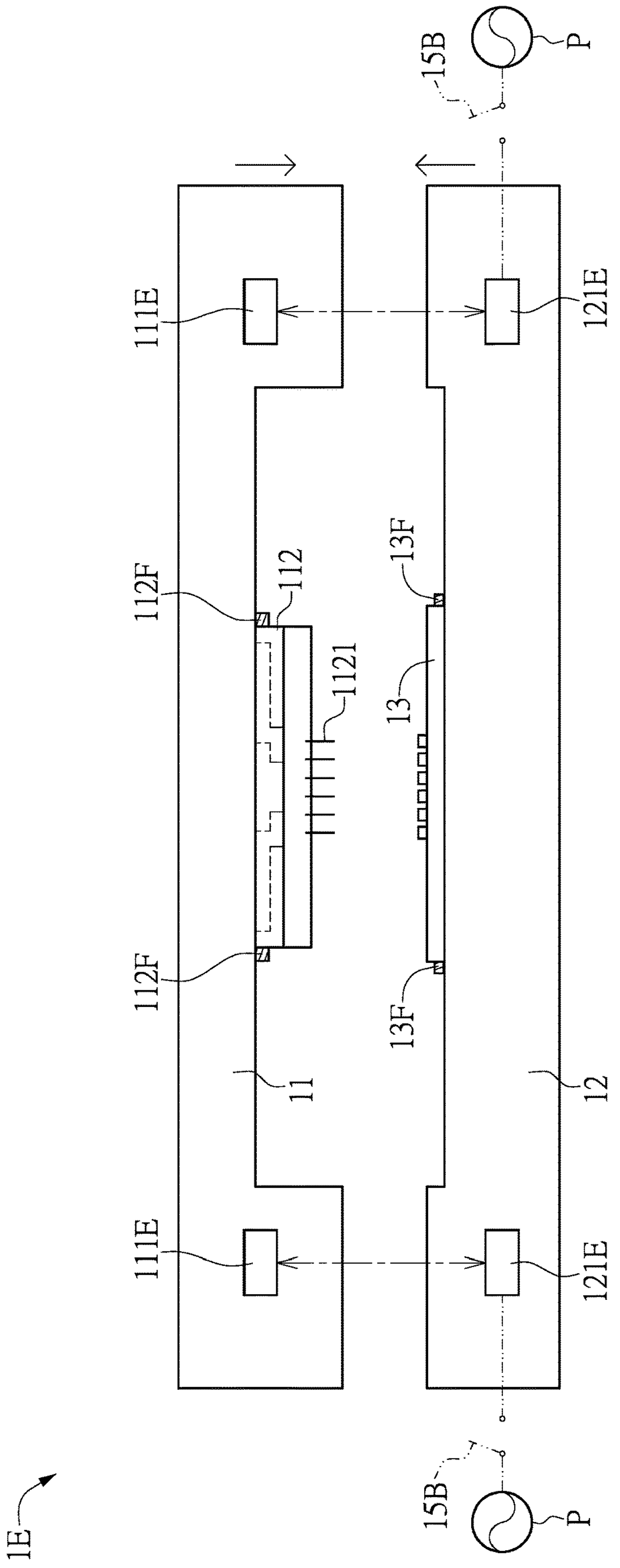
FIG. 8A is a first schematic view of the wafer test cassette according to a fifth embodiment of the present disclosure.
Figure 8B:
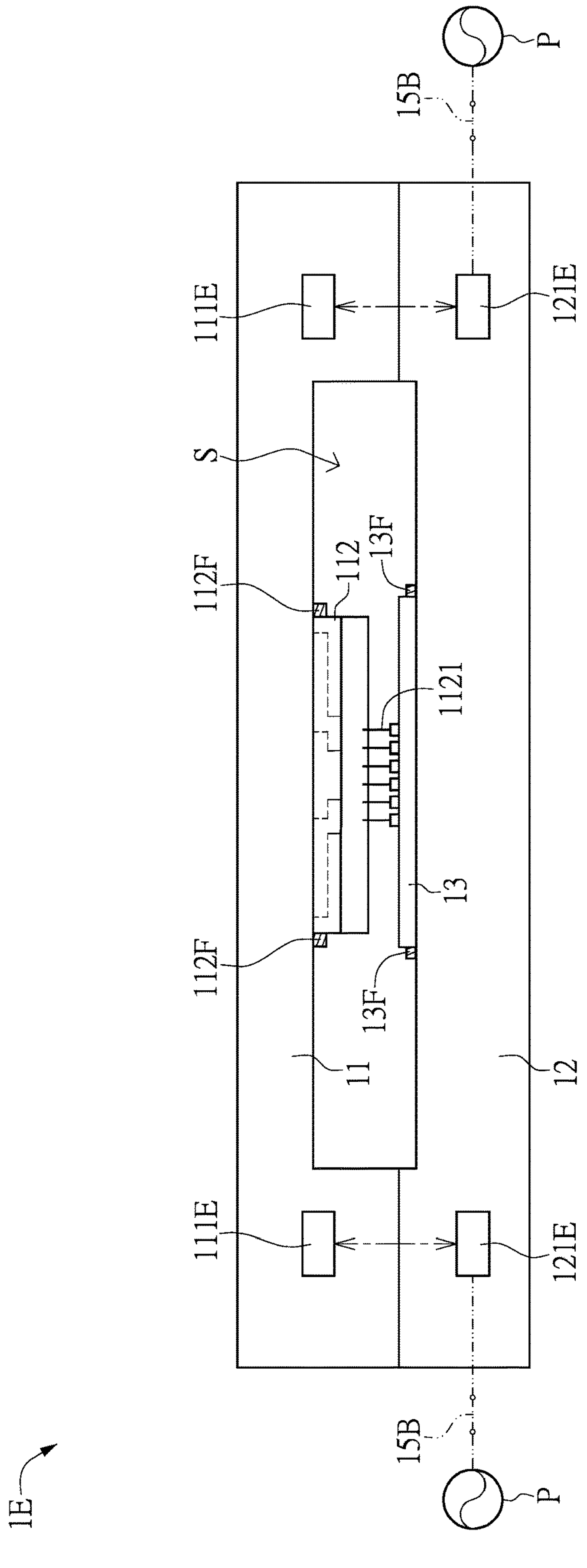
FIG. 8B is a second schematic view of the wafer test cassette according to the fifth embodiment of the present disclosure.
Figure 8C:
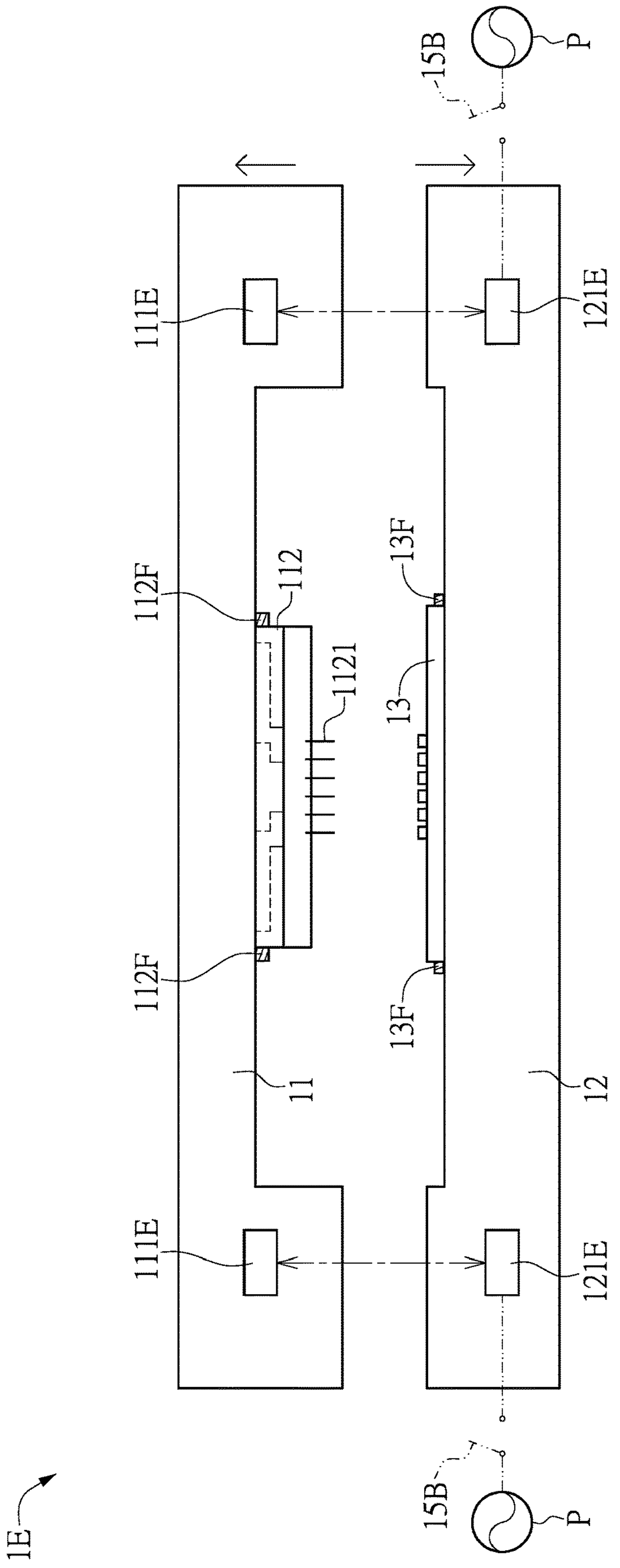
FIG. 8C is a third schematic view of the wafer test cassette according to the fifth embodiment of the present disclosure.

Reference is made to FIG. 8A, FIG. 8B, and FIG. 8C, in which FIG. 8A is a first schematic view of the wafer test cassette according to a fifth embodiment of the present disclosure, FIG. 8B is a second schematic view of the wafer test cassette according to the fifth embodiment of the present disclosure, and FIG. 8C is a third schematic view of the wafer test cassette according to the fifth embodiment of the present disclosure.

In the present embodiment, a structure and a function of a wafer test cassette 1E are similar to those of the wafer test cassettes 1A to 1C in the first embodiment. In the present embodiment, a first magnetic member 111E of the wafer test cassette 1E is the permanent magnet, a second magnetic member 121E is the non-permanent object, and the magnetic barrier assembly is a current switch 15B connected to a power supply P.

As shown in FIG. 8A, the current switch 15B is configured to turned on, and the magnetic attraction is not generated between the first member 111 and the second magnetic member 121. At this time, the first housing 11 and the second housing 12 approach to be in contact with each other. As shown in FIG. 8B, when the first housing 11 and the second housing 12 are in contact with each other, the current switch 15 is configured to be turned down. At this time, the magnetic attraction is generated between the first magnetic member 111 and the second magnetic member 121, so that the first housing 11 and the second housing 12 can be tightly coupled to each other, resulting in the interlocking effect for the first housing 11 and the second housing 12. As shown in FIG. 8C, after the wafer 13 passes the test process, the current switch 15B is configured to be turned on, so that the magnetic attraction between the first magnetic member 111 and the second magnetic member 121 can be eliminated. In such way, the first housing 11 and the second housing 12 can be separated from each other in the effort saving manner.

In certain embodiments, the first magnetic member 111 is the non-permanent magnet, e.g., the electromagnet, and the second magnetic member 121 is the non-permanent magnet, e.g., the electromagnet. The first magnetic member 111 and the second magnetic member 121 are respectively connected to the magnetic barrier assemblies, which are the current switches 15B. That is, multiple current switches 15B are provided, and the multiple current switches 15B are respectively connected to the first magnetic member 111 and the second magnetic member 121. Similarly, as shown in FIG. 8A to FIG. 8C, a user may turn on/turn down the current switch 15B to generate/cut off (or eliminate) the magnetic attraction between the first magnetic member 111 and the second magnetic member 121, enabling the first housing 11 and the second housing 12 to be in close proximity, contacted with, and aligned with each other in the effort saving manner. After the first housing 11 and the second housing 12 are aligned with each other, the magnetic attraction is further generated to allow the first housing 11 and the second housing 12 to be tightly coupled to each other. After the wafer 13 passes the test process, the magnetic attraction is cut off (or eliminated) again to turn the first housing 11 and the second housing 12 into a state in which they can be easily separated.

In certain embodiments, the magnetic barrier assembly is a processor connected to the power supply P. The processor is configured to vary an intensity of the magnetic field by increasing or decreasing a current intensity, thereby eliminating or reducing the magnetic attraction when the first housing 11 and the second housing are in close proximity and in contact, and generating or enhancing the magnetic attraction when the first housing 11 and the second housing 12 are configured to be tightly coupled to each other. After the wafer 13 passes the test process, the processor is configured to reduce or eliminate the magnetic attraction by reducing the current intensity to turn the first housing 11 and the second housing into a state in which they can be separable from each other. In the present embodiment, the power supply P can be a battery or a direct current power generating circuit to provide electric energy to the first magnetic member 111E or the second magnetic member 121E. In the case that the power supply P is the battery, the power supply P can be a lithium ion battery, a lithium manganese dioxide battery, a lithium polymer battery, or a nickel metal hydride battery.

Figure 9:
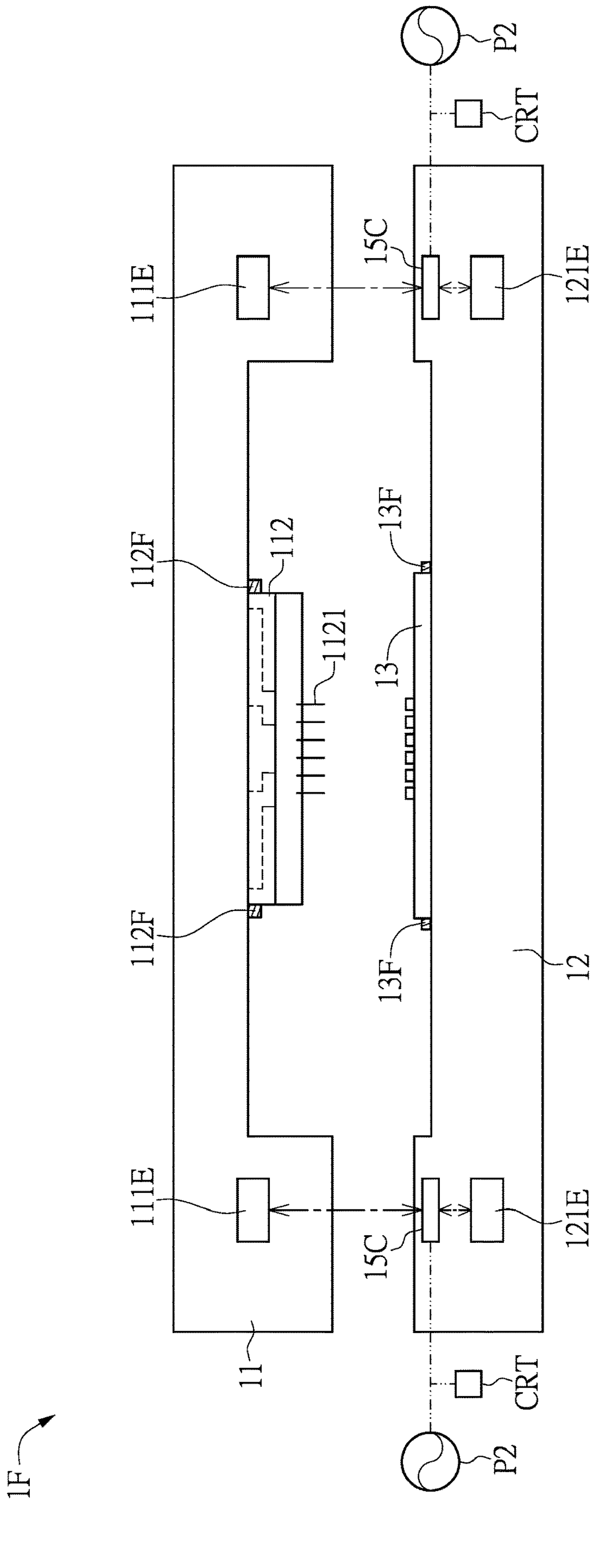
FIG. 9 is a schematic view of the wafer test cassette according to a sixth embodiment of the present disclosure.

Referring to FIG. 9, in the present embodiment, the magnetic barrier assembly is a magnetic force generating assembly 15C, such as the electromagnet, disposed between the first magnetic member 111E and the second magnetic member 121E. The magnetic force generating assembly 15C is configured for shielding or modulating the magnetic attraction between the first magnetic member 111E and the second magnetic member 121E. In such case, each of the first magnetic member 111E and the second magnetic member 121E can be the permanent magnet or the unmagnetized magnetically permeable object. In the present embodiment, the magnetic force generating assembly 15C is disposed in the second housing 12. The magnetic force generating assembly 15 is correspondingly connected to a control circuit CRT and an external power supply P2.

In the embodiment shown in FIG. 9, one surface of the magnetic force generating assembly 15C facing the first magnetic member 111E has a polarity same as a polarity of the first magnetic member 111E (e.g., both are N poles), and another surface of the magnetic force generating assembly 15C facing the second magnetic member 121E has a polarity same as a polarity of the second magnetic member 121E (e.g., both are S poles).

When the first housing 11 and the second housing 12 are about to be in close proximity and in contact with each other, the control circuit CRT is configured to control the current intensity flow through the magnetic force generating assembly 15C, so that each of a repulsion force between the magnetic force generating force 15C and the first magnetic member 111E and a repulsion force between the magnetic force generating assembly 15C and the second magnetic member 121E is less or slightly less than the magnetic attraction between the first magnetic member 111E and the second magnetic member 121E. When the first housing 11 and the second housing 12 are aligned and in contact with each other, the control circuit CRT is configured to gradually reduce the current flowing through the magnetic force generating assembly 15C, so that each of the repulsion force between the magnetic force generating force 15C and the first magnetic member 111E and the repulsion force between the magnetic force generating assembly 15C and the second magnetic member 121E is reduced or eliminated, whereby the first housing 11 and the second housing 12 are tightly coupled to each other. After the wafer 13 passes the test process, the control circuit CRT is configured to increase the current flowing through the magnetic force generating assembly 15C, so that each of the repulsion force between the magnetic force generating force 15C and the first magnetic member 111E and the repulsion force between the magnetic force generating assembly 15C and the second magnetic member 121E is increased or generated to be greater than the magnetic attraction between the first magnetic member 111E and the second magnetic member 121E. In such a way, the first housing 11 and the second housing 12 are turned into the state in which they can be easily separable from each other.

Beneficial Effects of the Embodiments

In conclusion, in the wafer test cassette provided by the present disclosure, by virtue of "the wafer test cassette including the first housing and the second housing," "the first housing including the first magnetic member and the second housing including the second magnetic member," "when the first housing and the second housing are in close proximity, the magnetic attraction is generated to combine and fix the first housing and the second housing," and "the magnetic barrier assembly being configured to reduce or eliminate the magnetic attraction between the first magnetic member and the second magnetic member, so that the first housing and the second housing can be separated," a structure of the wafer test cassette can be strengthened. In addition, the combination and fixation of the first housing and the second housing can be strengthened, and alignment accuracy during the combination of the first housing and the second housing, thereby improving an effect of the wafer test cassette on fixing the wafer.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A wafer test cassette, comprising:

a first housing including at least one first magnetic member;

a second housing including at least one second magnetic member, the second magnetic member being arranged corresponding to the first magnetic member; wherein, when the first housing and the second housing are correspondingly in contact with each other, an accommodating space is defined between the first housing and the second housing;

a magnetic barrier assembly configured to be connected to the first housing or the second housing for reducing or eliminating magnetic attraction generated between the first magnetic member and the second magnetic member; and a probe card and a wafer disposed in the accommodating space;

wherein the magnetic barrier assembly is configured to reduce or eliminate the magnetic attraction before the first housing and the second housing are in contact with each other;

wherein, when the first housing and the second housing are correspondingly in contact with each other, an effect of the magnetic barrier assembly is released, so that the first housing and the second housing are tightly coupled to each other through the magnetic attraction; and wherein the first housing and the second housing tightly coupled to each other through the magnetic attraction are configured to be separable by using the magnetic barrier assembly to reduce the magnetic attraction;

wherein a first fixing member is configured on an outer edge of the probe card, a second fixing member is configured on an outer edge of the wafer;

wherein the first magnetic member is a permanent magnet, and the second magnetic member is the permanent magnet or an unmagnetized magnetically permeable object; wherein the magnetic barrier assembly is disposed in the first housing or the second housing and between the first magnetic member and the second magnetic member; wherein, when the magnetic barrier assembly is configured to move a position to shield the first magnetic member or the second magnetic member, the magnetic attraction generated between the first magnetic member and the second magnetic member is reduced.

2. The wafer test cassette according to claim 1, wherein the magnetic barrier assembly is a magnetic shielding member or a magnetic force generating assembly.

3. The wafer test cassette according to claim 2, wherein, when the magnetic barrier assembly is the magnetic force generating assembly, the magnetic force generating assembly is configured to modulate the magnetic attraction between the first magnetic member and the second magnetic member so that the first housing and the second housing are tightly coupled with each other or separated.

4. The wafer test cassette according to claim 1, wherein the first magnetic member is a non-permanent magnet, the second magnetic member is a paramagnetic object, and the magnetic barrier assembly is configured to control whether or not the first magnetic member to generate a magnetic force; wherein the magnetic barrier member is connected to the first magnetic member.

5. The wafer test cassette according to claim 1, wherein multiple first magnetic members and multiple second magnetic members are provided, and a number of the multiple first magnetic members is the same as a number of the multiple second magnetic members.

6. The wafer test cassette according to claim 1, further comprising a seal member disposed at a periphery of the accommodating space, and the accommodating space is defined by the first housing, the second housing, and the seal member.

7. The wafer test cassette according to claim 1, wherein the first housing has at least one first positioning structure, the second housing has at least one second positioning structure, and the first positioning structure and the second positioning structure are arranged correspondingly so as to allow the first housing and the second housing to be correspondingly in contact with each other.

8. The wafer test cassette according to claim 7, wherein one side of the first housing has a first protruding structure, one side of the second housing has a second protruding structure, and the first protruding structure and the second protruding structure are arranged correspondingly; wherein, when the first housing and the second housing are tightly coupled to each other, the first protruding structure and the second protruding structure are tightly coupled to each other.

9. The wafer test cassette according to claim 1, wherein one side of the first housing has a first protruding structure, one side of the second housing has a second protruding structure, and the first protruding structure and the second protruding structure are arranged correspondingly; wherein, when the first housing and the second housing are tightly coupled to each other, the first protruding structure and the second protruding structure are tightly coupled to each other.

10. The wafer test cassette according to claim 9, wherein the accommodating space is defined by the first housing, the first protruding structure, the second housing, and the second protruding structure.

11. The wafer test cassette according to claim 1, wherein the first housing is configured to carry the probe card, and the probe card includes at least one probe; wherein, when the first housing and the second housing are coupled to each other, the at least one probe projects toward the second housing;

wherein the wafer has at least one pad, and the second housing is configured to carry the wafer; wherein, when the first housing and the second housing are coupled to each other, the at least one probe is configured to be in contact with the at least one pad of the wafer.

* * * * *